United States Patent
Mason

(10) Patent No.: US 7,157,954 B2
(45) Date of Patent: Jan. 2, 2007

(54) SEMICONDUCTOR TYPE TWO PHASE LOCKED LOOP FILTER

(75) Inventor: James Stephen Mason, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 10/722,178

(22) Filed: Nov. 25, 2003

(65) Prior Publication Data

US 2004/0108905 A1    Jun. 10, 2004

(30) Foreign Application Priority Data

Dec. 7, 2002    (GB)    ................. 0228611.0

(51) Int. Cl.
*H03K 5/08*    (2006.01)
(52) U.S. Cl. ............... 327/311; 327/312; 327/553
(58) Field of Classification Search ............ 331/16, 331/17; 327/311, 312, 551–559
See application file for complete search history.

(56) References Cited

U.S. PATENT DOCUMENTS

| | | | |
|---|---|---|---|
| 5,384,502 A * | 1/1995 | Volk | 327/157 |
| 6,320,470 B1 * | 11/2001 | Arai et al. | 331/17 |
| 6,420,917 B1 * | 7/2002 | Klemmer | 327/156 |
| 6,437,615 B1 * | 8/2002 | Stascausky | 327/156 |
| 6,437,639 B1 * | 8/2002 | Nguyen et al. | 327/558 |
| 6,462,594 B1 * | 10/2002 | Robinson et al. | 327/159 |
| 6,483,390 B1 * | 11/2002 | Welland | 331/36 C |
| 6,542,040 B1 * | 4/2003 | Lesea | 331/11 |
| 6,559,715 B1 * | 5/2003 | Frake et al. | 327/558 |
| 6,628,163 B1 * | 9/2003 | Dathe et al. | 327/553 |
| 6,664,826 B1 * | 12/2003 | Creed et al. | 327/147 |
| 6,714,066 B1 * | 3/2004 | Gorecki et al. | 327/553 |
| 6,873,214 B1 * | 3/2005 | Harwood | 331/17 |

* cited by examiner

*Primary Examiner*—Timothy P. Callahan
*Assistant Examiner*—Hai L. Nguyen
(74) *Attorney, Agent, or Firm*—Zilka-Kotab, PC

(57) ABSTRACT

There is described a semiconductor Type Two phased locked loop filter having a passive capacitor part and a variable active resistor part, the variable active resistor part being integrated with the passive capacitor part. Integrating an active variable resistor will apply the same change to both poles and has no effect on the loop gain. The variable active resistor part is controlled by a resistor regulator circuit operating from a voltage that follows the type two phased locked loop voltage. The resistor regulator circuit is bootstrapped to the phased locked loop voltage using a voltage follower configured op-amp.

17 Claims, 2 Drawing Sheets

Filter Control System

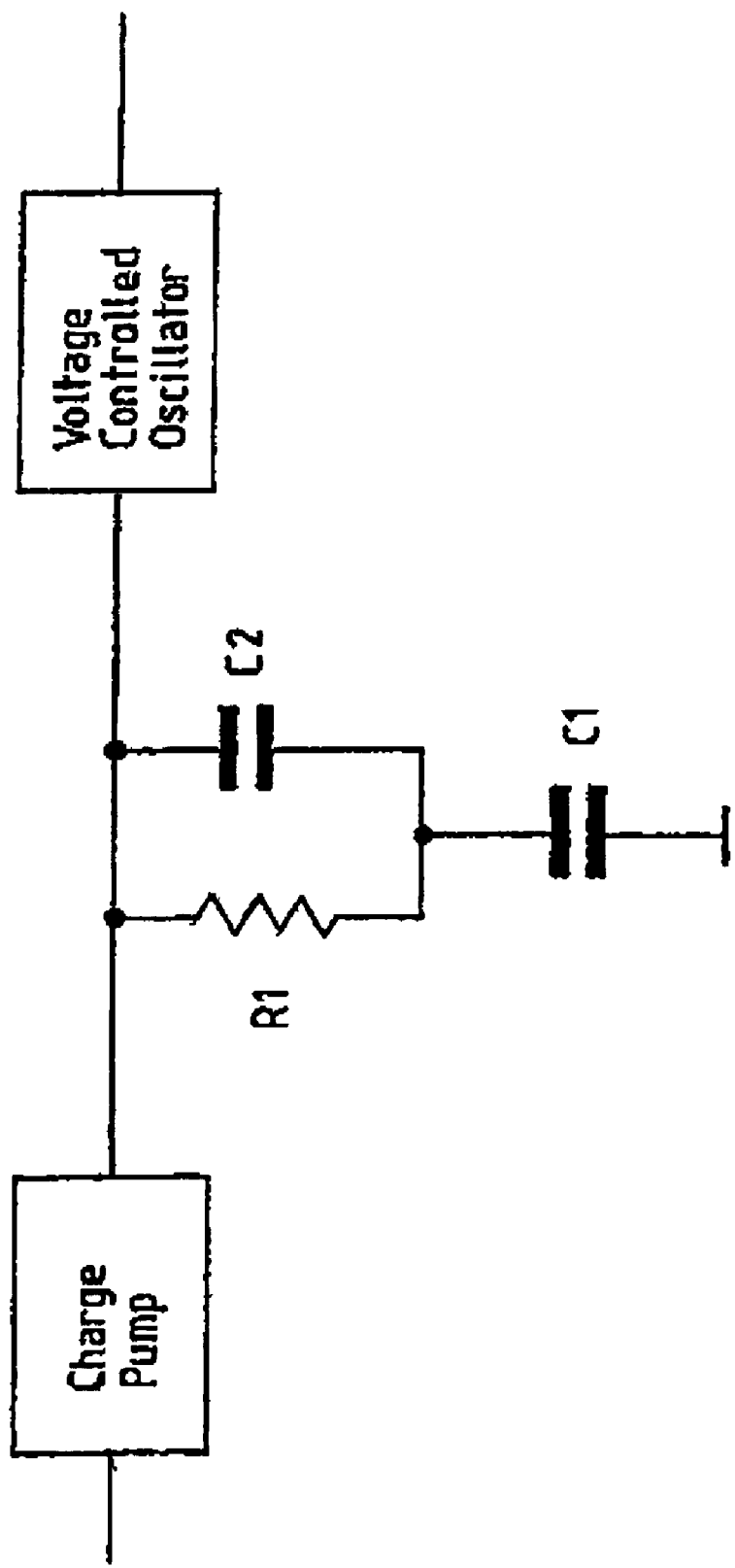
FIG. 1  Type 2 PLL Filter Network
(Prior Art)

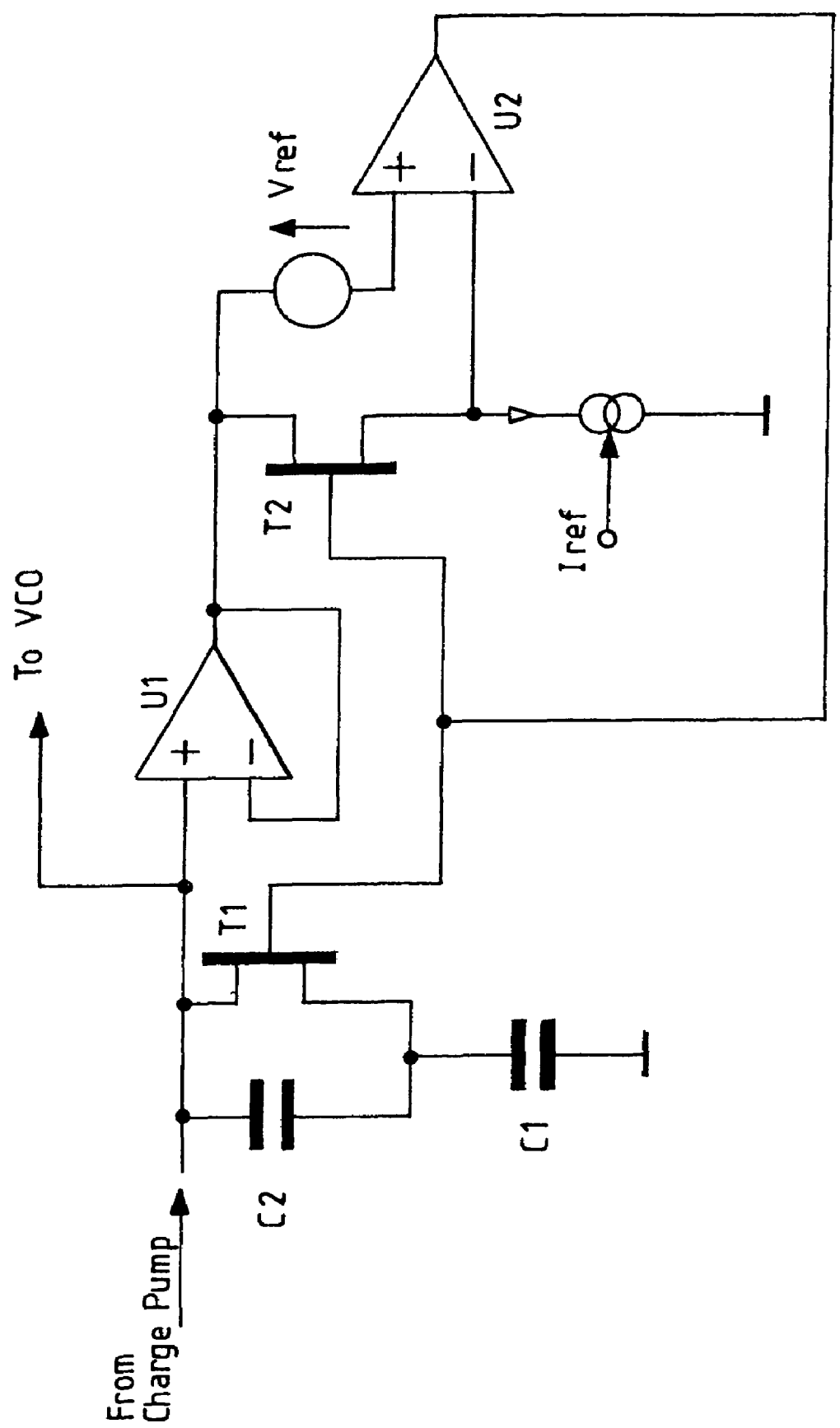
FIG. 2  Filter Control System

SEMICONDUCTOR TYPE TWO PHASE LOCKED LOOP FILTER

FIELD OF INVENTION

This invention relates to apparatus for a semiconductor type two phased locked loop (PLL) filter.

BACKGROUND OF THE INVENTION

A Type Two PLL filter system has the well known form shown below in FIG. 1. A charge pump circuit operates under the control of a phase/frequency detector to develop a voltage across the filter network formed by resistor (R1), and capacitor (C1 and C2) which provides the input to a voltage controlled oscillator (VCO). The poles of the filter are set by time constants $t=R1(C1+C2)$ and $t2=R1C2$ and in many applications it is necessary to tune this filter network during operation, for example to compensate for process/operating changes or to change the dynamics of the PLL system during a different mode of operation. When this filter is integrated, this is often performed by changing one of the capacitor values, usually C1. However, C1 is also a parameter in the open loop gain of the PLL and changes in its value often necessitate a change in another of the gain parameters such as the charge pump current to prevent the PLL gain from also changing.

One method of keeping a constant gain is to maintain a fixed relationship between $\tau1$ and $\tau2$ and changing C2 proportionally with C1. This introduces more complexity since it is difficult for C1 to accurately track C2 because of their different bias conditions. A capacitor is relatively easy to adjust within integrated circuit application and can be conveniently formed using a MIS (metal-insulator-semiconductor) or diffused junction structure. A proportion of this capacitance can be controlled by adjusting the bias on this structure which can be done with switching transistors or through some form of continuous control using a linear circuit.

The switching devices are large so as to reduce the parasitic resistance that is introduced. This in turn introduces parasitic capacitances so the design of this arrangement can be difficult.

Furthermore it is problematic to implement capacitors within integrated circuit processes when one side of the capacitor does not connect to ground, that is a floating capacitor. When a capacitor is implemented in this 'floating' configuration, it will normally have a significant parasitic capacitance to ground and occupies a greater silicon area for the same value of capacitance. When implementing switching devices, these are often also more conveniently configured as switches to ground and so this tends to favour the adjustment of the component at this side of the filter normally combined with C1.

As has already been mentioned in the disclosure, adjusting C1 affects the gain of the PLL system and so normally requires a further secondary adjustment (normally to the charge pump current). Another problem is that adjusting C1 only changes the lower frequency pole $\tau1$ and usually it would be desirable to change both poles $\tau1$ and $\tau2$ simultaneously to maintain a transient response. However, adjustment of the second capacitor C2 is more difficult and often not implemented.

It is desirable to allow the adjustment of both poles simultaneously which avoids the problems of adjusting a single pole only. Retaining a fixed relationship between the two poles in the filter maintains a given transient response for the PLL system.

DISCLOSURE OF THE INVENTION

According to a first aspect of the present invention there is provided a semiconductor type two phased locked loop filter having a passive capacitor part and an active resistor part; said active resistor part being integrated with the passive capacitor part.

Integrating an active resistor will apply the same change to both poles and has no effect on the loop gain.

The preferred embodiment describes the active resistor using standard FET devices. The scheme employed also allows continuous control over this component.

The active resistor part may advantageously comprise a transistor.

The active resistor is preferably continuously variable.

The active resistor part is suitably controlled by a resistor regulator circuit operating from a voltage that follows the type two phased locked loop voltage.

The resistor regulator circuit may be bootstrapped to the phased locked loop voltage using a voltage follower configured op-amp.

Advantageously, the resistor regulator circuit comprises a current source and a voltage source.

The current source may be tied to the charge pump current and the voltage source is used to tune the active resistor. The advantage of this is better correspondence in the device current and therefore better matching.

Alternatively the voltage source is suitably tied and the current source is used to tune the active resistor since it is easier to implement a variable current source in CMOS.

Advantageously the passive capacitor part, the active resistor part, the resistor regulator circuit and the voltage follower are all made in the same CMOS manufacturing steps and no special steps for including resistor components is required.

This disclosure describes a scheme for accurately controlling the response of a type two PLL filter system which is particularly suited to on-chip applications using standard CMOS components. By tuning the resistive component using an active component rather than tuning a variable capacitive element or a bank of switching resistors the following advantages result:

(1) only one component needs to be tuned to adjust the filter response whereas with capacitive tuning two parameters would normally need to change to compensate for resulting changes in PLL loop gain;

(2) both of the poles can be tuned simultaneously, with their relative separation remaining fixed since this is set by the ratio of the capacitor values only.

(3) the system uses standard components and only requires a reference current source which will already be available within a PLL system for the charge pump circuit and a voltage reference which is also normally available on a chip containing PLL circuits.

Furthermore the embodiment can provide a silicon area saving over a bank of precise switching resistors or capacitors. Since integrated resistors can be relatively large in area for applications where reasonable accuracy is required, a higher resistor width is needed to minimise photolithographic tolerance. By implication, a high width will result in a proportionally higher length to achieve a given resistor value and so the area of the resistor increases as a square law. High value resistors are also difficult to implement in integrated circuit applications and the scheme described can be particularly beneficial in filter applications which require high values of resistance.

Although the overall area of the active resistor circuitry may be greater than a single passive resistor, using a transistor to implement a resistor is more efficient because the resistive and capacitive parasitic values associated with the transistor will be less than those of the equivalent resistor. In this filter application, the parasitic capacitance down to ground is probably the most important and can make high values of resistance impractical since the effect of the resistor's parasitic capacitance upsets the filter performance.

The filter network is also often the most sensitive area of the PLL system for noise sensitivity. Reducing the area of the active components of the filters reduces the sensitivity to noise pick-up from adjacent wiring on the chip. Using a small transistor to implement the resistor can provide an advantage in this respect. Even though more area is required for the control circuitry, this can more easily be made to be less sensitive to external noise sources. This is because it is effectively not part of the PLL feedback system and its transient performance requirements can be much lower than for the main PLL system.

The capacitive part comprises two capacitors in series, a top capacitor connected to the charge pump and the bottom capacitor connected to ground. The active resistor is connected in parallel across the top capacitor.

When the ground-connected capacitor is the larger of the two, then the resistive part is connected across the smaller capacitor (the phased lock loop connected capacitor) as this is the most efficient configuration. Implementing floating capacitors is difficult so it is easier to make the floating capacitor the smaller.

BRIEF DESCRIPTION OF THE DRAWINGS

In order to promote a fuller understanding of this and other aspects of the present invention, an embodiment of the invention will now be described, by means of example only, with reference to the accompanying drawings in which:

FIG. 1 is a circuit diagram of a standard Type Two phase lock filter; and

FIG. 2 is a circuit diagram of the present embodiment of the invention.

DESCRIPTION OF THE PREFERRED EMBODIMENTS

FIG. 2 shows the presently preferred embodiment of the present invention with a FET device, T1, being used to implement the active resistor element within a feedback system enabling accurate control of the resistance value. In this arrangement a voltage follower U1 is used to 'bootstrap' a reference FET device, T2, in the feedback control section to the filter voltage which is under the control of a voltage controlled oscillator (VCO). A current reference, Iref, which can be conveniently derived from the same source as that used to define the charge pump current in the PLL system, is used to define a voltage across T2. This voltage is then compared by an op-amp U2 to a reference voltage Vref and a feedback loop formed by U2 controls T2 (and subsequently T1) such that it simulates a resistance set by Vref/Iref. It is possible to control Iref or Vref to achieve continuous control of the resulting resistor value and therefore PLL filter response. This basic scheme can be used in various circuit topologies to implement a Type Two filter. Since capacitor C1 is larger than capacitor C2, it is normally most efficient to have this capacitor connected at the bottom of the filter (normally ground) within chip applications. Ideally the control loop for the resistance controller needs to have a dynamic response which is better than the PLL system so that the resistor value is maintained during changes in the filter voltage, and this can be provided by this system.

Voltage follower U1 is a conventional operational amplifier configured as a feedback circuit. The voltage follower circuit forces one node to follow another while it decouples the nodes from each other. This decouples the control circuitry from the active resistor. U2 is a conventional operational amplifier configured as a comparator. FETs T1 and T2 are configured as a matched pair so the voltages controlled by U2 at their gates are the same and the voltages at their sources (from the charge pump and decoupled by U1) are the same. Consequently the voltage at the drain of T1 will be the same as the voltage at the drain of T2.

PLLs have very wide application within electronic design and Type Two systems are very widespread since they are relatively easy to analyse in terms of control theory and consequently their performance is both well understood and deterministic. A typical application would be a frequency synthesizer, for example, within a tuning system on a mobile phone handset. As the frequency is changed on the synthesizer then a different dynamic performance may be required which requires a modification to the filter response to, for example, achieve a better response to disturbances on the input signal. An embodiment of the present invention allows this to be done without affecting the gain of the system which could be undesirable.

What is claimed is:

1. A semiconductor Type Two phased locked loop filter having a passive capacitor part and an active resistor part; said active resistor part being integrated with the passive capacitor part,
   wherein the Type Two phased locked loop filter operates from a voltage, wherein the active resistor is continuously variable and is controlled by a regulator circuit that follows the type two phased locked loop voltage.

2. The filter as in claim 1 wherein the active resistor is a standard FET device, the active resistor part having a continuously adjustable resistance.

3. The filter as in claim 1 wherein all the parts are made in the same CMOS manufacturing step.

4. The filter as in claim 1 wherein a resistance of the active resistor is controlled by a feedback loop coupled to an input of the active resistor part.

5. The filter as in claim 1 wherein a capacitor is positioned between a drain side of the active resistor part and ground.

6. The filter as in clam 1 wherein the passive capacitor part includes two capacitors, wherein the filter has two poles, wherein the active resistor part adjusts the poles simultaneously.

7. The filter as in claim 1 wherein the passive capacitor part includes two capacitors, wherein the active resistor part is coupled parallel to a capacitor not directly coupled to ground.

8. The filter as in claim 1 wherein the active resistor part is controlled by a regulator circuit, wherein the regulator circuit comprises a current source and a voltage source.

9. A semiconductor Type Two phased locked loop filter having a passive capacitor part and an active resistor part; said active resistor part being integrated with the passive capacitor part, wherein the Type Two phased locked loop filter operates from a voltage and the active resistor part is controlled by a regulator circuit operating from a voltage that follows the type two phased locked loop voltage.

10. The filter as in claim 9 wherein the regulator circuit is bootstrapped to the phased locked loop voltage using a voltage follower configured op-amp.

11. The filter as in claim 9 wherein the phased locked loop filter has a current and regulator circuit comprising a current source and a voltage source wherein the current source is tied to the phased locked loop filter current and the voltage source is used to tune the active resistor.

12. The filter as in claim 9 wherein the phased locked loop filter has a current and regulator circuit comprising a current source and a voltage source wherein the voltage source is tied to the phased locked loop voltage and the current source is used to tune the active resistor.

13. A method of manufacturing a semiconductor Type Two phased locked loop filter comprising:

providing a passive capacitor part and an active resistor part; said active resistor part being integrated with the passive capacitor part, wherein the Type Two phased locked loop filter operates from a voltage, wherein the active resistor is continuously variable and is controlled by a regulator circuit that follows the type two phased locked loop voltage.

14. A method as claimed in claim 13 wherein all the parts are made in the same CMOS manufacturing step whereby no special steps for including resistor components is required.

15. A method as claimed in claim 13 wherein the active resistor part has a continuously adjustable resistance.

16. A semiconductor phased locked loop system comprising:

a charge pump;

a voltage controller oscillator; and a Type Two filter comprising a passive capacitor part and an active resistor part, said active resistor part being integrated with the passive capacitor part, wherein the Type Two phased locked loop filter operates from a voltage, wherein the active resistor is continuously variable and is controlled by a regulator circuit that follows the type two phased locked loop voltage.

17. The system as in claim 16 wherein the active resistor part has a continuously adjustable resistance.

* * * * *